United States Patent [19]

Sato et al.

[11] Patent Number: 4,559,617

[45] Date of Patent: Dec. 17, 1985

[54] MAGNETIC BUBBLE MEMORY DEVICE

[75] Inventors: Toshihiro Sato; Ryo Suzuki, both of Hachioji; Tadashi Ikeda, Kanagawa; Masatoshi Takeshita, Hachioji; Yutaka Sugita, Tokorozawa, all of Japan

[73] Assignee: Hitachi, Ltd., Tokyo, Japan

[21] Appl. No.: 635,169

[22] Filed: Jul. 27, 1984

[30] Foreign Application Priority Data

Aug. 3, 1983 [JP] Japan .................. 58-141229

[51] Int. Cl.⁴ .............................. G11C 19/08
[52] U.S. Cl. ...................... 365/36; 365/43
[58] Field of Search .................. 365/36, 43

[56] References Cited

U.S. PATENT DOCUMENTS 4,346,456 8/1982 Kinoshita et al. .............. 365/36
4,503,517 3/1985 Umezaki et al. ................ 365/36

FOREIGN PATENT DOCUMENTS 0125289 7/1983 Japan ........................... 365/36

Primary Examiner—James W. Moffitt
Attorney, Agent, or Firm—Antonelli, Terry & Wands

[57] ABSTRACT

A high density magnetic bubble memory device comprises first magnetic bubble propagation tracks formed through ion implantation and second magnetic bubble propagation tracks formed of a soft magnetic material. Regions exclusive of those destined for realization of the second magnetic bubble propagation tracks are deeply ion-implanted. Gaps between the adjacent soft magnetic material films are also deeply ion-implanted. The second magnetic bubble propagation tracks may be shallowly ion-implanted or not implanted with ions.

6 Claims, 8 Drawing Figures

MAGNETIC BUBBLE MEMORY DEVICE

BACKGROUND OF THE INVENTION

The present invention relates to a hybrid magnetic bubble memory device, i.e. a magnetic bubble memory device in which magnetic bubble propagation tracks formed through ion implantation and magnetic bubble propagation tracks formed of a soft magnetic material exemplified by permalloy (Ni-Fe alloy) are coexistent in a single chip. More especially, the present invention relates to the propagation tracks of soft magnetic material in such a hybrid device.

At present, magnetic bubble propagation tracks formed of permalloy is widely employed as the bubble propagation track in the magnetic bubble memory device. However, high density propagation tracks of permalloy having a periodicity not larger than 4 μm can afford only a small propagation margin and is not suited for practical applications. In contrast, it is known that ion-implanted propagation tracks formed through ion implanation by means of a gapless pattern is practically suited for realizing high density propagation tracks of a periodicity not larger than 4 μm. Details of ion-implanted bubble propagation tracks are disclosed in T. J. Nelson el, "Design of Bubble Device Elements Employing Ion-Implanted Propagation Patterns", The Bell System Technical Journal, Vol. 59, No. 2, pp. 229–257. However, the ion-implanted propagation tracks are not yet practically employed in the magnetic bubble memory device because functional parts such as replicate gates, swap gates and others which are requisite for the magnetic bubble memory device do not operate satisfactorily. As to these functional parts, an adequate operation margin can be accomplished by employing the permalloy propagation tracks. Accordingly, it may be said that a so-called hybrid magnetic bubble memory device in which a storage area occupying the most part of the chip area is realized by the ion-implanted propagation tracks while the functional parts are realized by the permalloy propagation tracks, is suited for realization with an increased density. For particulars of such a hybrid magnetic bubble memory device, reference may be made to Japanese Patent Application Laid-Open No. 57-40791 laid open in 1982.

A structure of the hybrid device is shown in FIG. 1 of the accompanying drawings. In the figure, the permalloy propagation tracks are represented by portions 1 depicted in solid lines, while the ion-implanted propagation tracks are represented by broken line portions 2. A region 3 enclosing therein the ion-implanted tracks 2 is implanted with ions on the same condition for realizing the ion-implanted propagation tracks 2. On the other hand, a region 4 extending around the ion-implanted region 3 and including the permalloy propagation tracks 1 is not implanted with ions or is shallowly implanted under an ion implanting condition different from that for the region 3 and for the purpose of suppressing generation of hard bubbles. In FIG. 1, reference numeral 5 denotes a magnetic bubble generator and numeral 6 denotes a magnetic bubble detector.

In the hybrid device of the structure mentioned above, importance is put on the range of operation of the magnetic bubbles for each of the ion-implanted propagation track and the permalloy propagation track in the regions 3 and 4 which are formed under the different ion-implanting conditions.

FIG. 2 illustrates the operation ranges of the ion-implanted propagation track having a periodicity of 8 μm and the permalloy propagation track having a periodicity of 16 μm when that magnetic bubbles having a diameter of 2 μm are made use of. As will be seen from this figure, the operation ranges of both the propagation tracks for the 2 μm diameter bubbles are substantially coincident with each other, giving rise to no problem. However, when the magnetic bubbles of a diameter smaller than 1 μm, e.g. 0.5 μm are used in the case where the periodicities of the ion-implanted and permalloy propagation tracks are same as the above, it has been found that the operation range of the bubble in the permalloy propagation track is shifted to a higher region of the bias magnetic field as compared with that in the ion-implanted propagation track and has also the decreased width, as will be seen from FIG. 3. For these reasons, a great difficulty has been encountered in assuring the operation range of the magnetic bubble common to both type of the propagation tracks, involving difficulty in realizing a high reliable hybrid device.

SUMMARY OF THE INVENTION

An object of the invention is to provide a high density hybrid magnetic bubble memory device in which the permalloy propagation track exhibits good characteristics compatible with the operation range of the ion-implanted propagation track.

A magnetic bubble device according to the present invention comprises first magnetic bubble propagation tracks formed through ion implantation and second magnetic bubble propagation tracks formed along films of a soft magnetic material. The second magnetic bubble propagation tracks are formed so that a region exclusive of a bubble path on the magnetic material film along which a magnetic bubble is to move is ion-implanted more deeply than the bubble path.

The invention starts from the newly established fact mentioned below.

Again referring to FIG. 3, it is noted that within a range A located below the lower limit of the operation range in the permalloy propagation track, the following undesirable phenomenon was observed. Namely, in the permalloy propagation track elements 11 of a chevron-like propagation pattern such as shown in FIG. 4 which elements 11 are formed on the region 4 implanted with no ions or ion-implanted shallowly as described hereinbefore in conjunction with FIG. 1, there is produced such an error that the magnetic bubble is stretched over two or more bits of the permalloy propagation track elements 11, as indicated by numeral 13 in FIG. 4, when an in-plane rotating field is orientated in a direction indicated by an arrow 12. In FIG. 4, signs (+) and (−) represent, respectively, positive poles and negative poles produced on the permalloy propagation track elements 11 when the in-plane rotating field is in the direction indicated by the arrow 12. From the results of measurements of the bubble collapsing field $H_o$ and others, it has been established that the error mentioned above is ascribable to the fact that the range of a bias field allowing the magnetic bubble to be present in the permalloy propagation track region (i.e. the region denoted by 4 in FIG. 1) is about 50 Oe higher than the bias field range which allows the bubble to be present in the ion-implanted propagation track region (i.e. the region 3 shown in FIG. 1).

In order to expand or enlarge the common operation range of the magnetic bubble notwithstanding of the fact that two different operation ranges are actually present as described above, it is necessary to cause the magnetic bubble to be propagated in the normal state along the permalloy propagation track within the range of the magnetic field designated by A in FIG. 3. To realize this, means or measures should be provided to inhibit the magnetic bubble propagating on the permalloy propagation track from being simultaneously stretched over to two or more attractive poles produced in the permalloy propagation track elements 11. To this end, it is contemplated with the present invention that a region excepting a moving path of magnetic bubbles inclusive of the permalloy propagation track elements 11 themselves and gap portions 14 therebetween is implanted with ions. With such a structure, a magnetic bubble on the permalloy propagation track is subjected to repulsion at a boundary between the ion-implanted region and the non-implanted region so that the magnetic bubble is moved in accordance with the movement of a magnetic pole on the permalloy propagation track element in response to the rotation of the in-plane rotating field while the magnetic bubble is positively prevented from being stretched unnecessarily to the other magnetic pole.

DESCRIPTION OF THE PREFERRED EMBODIMENTS

Now, the invention will be described in detail in conjunction with the exemplary embodiments.

Figure 1:
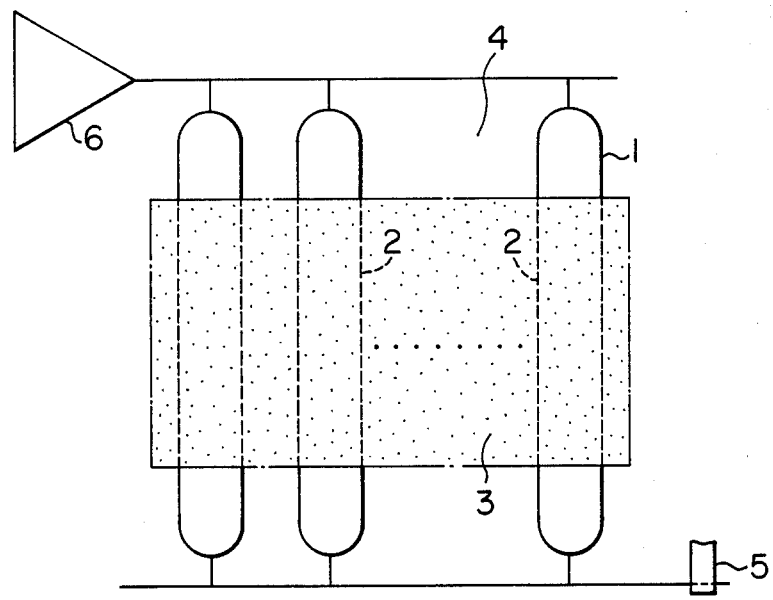
FIG. 1 is a plan view showing a structure of a magnetic bubble device incorporating magnetic bubble propagation tracks formed through ion implantation and magnetic bubble propagation tracks formed of a soft magnetic material.
Figure 2:
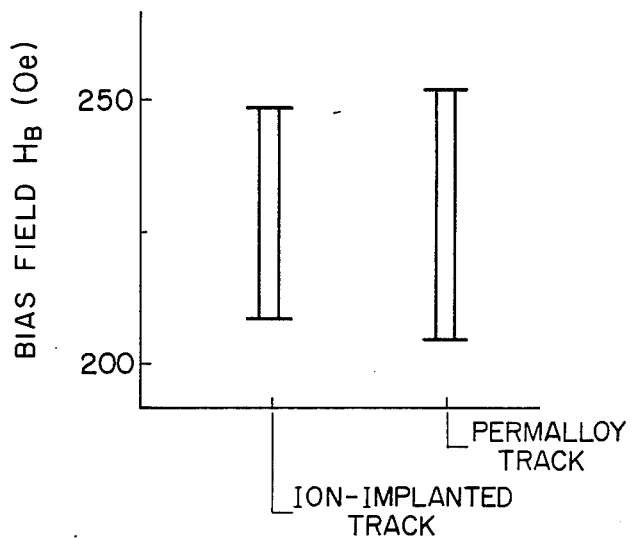
FIGS. 2 and 3 are views for illustrating operation ranges of magnetic bubbles in the ion-implanted propagation track and the soft magnetic propagation track for the magnetic bubbles of 2 $\mu$m and 0.5 $\mu$m in diameter, respectively.
Figure 3:
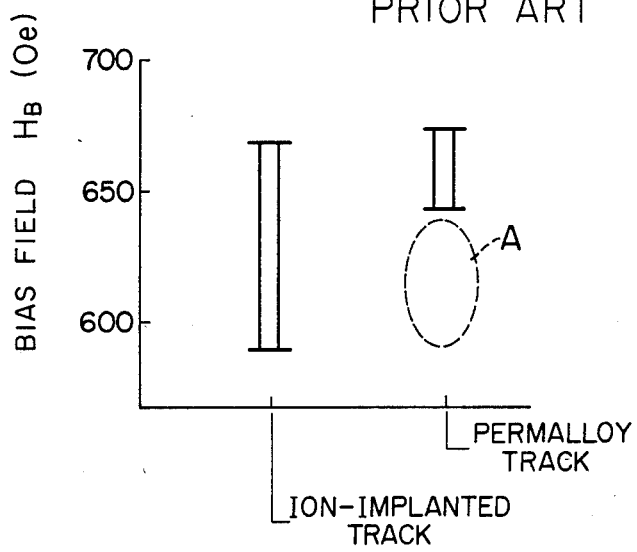
Figure 4:
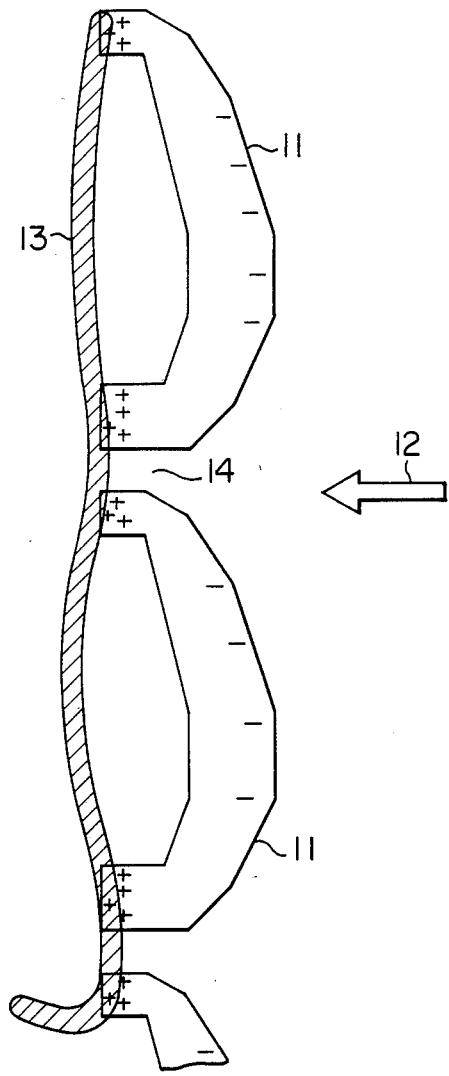
FIG. 4 is a plan view for illustrating generation of error due to the stretching of a magnetic bubble on the hitherto known bubble propagation track formed of the soft magnetic material.
Figure 5A:
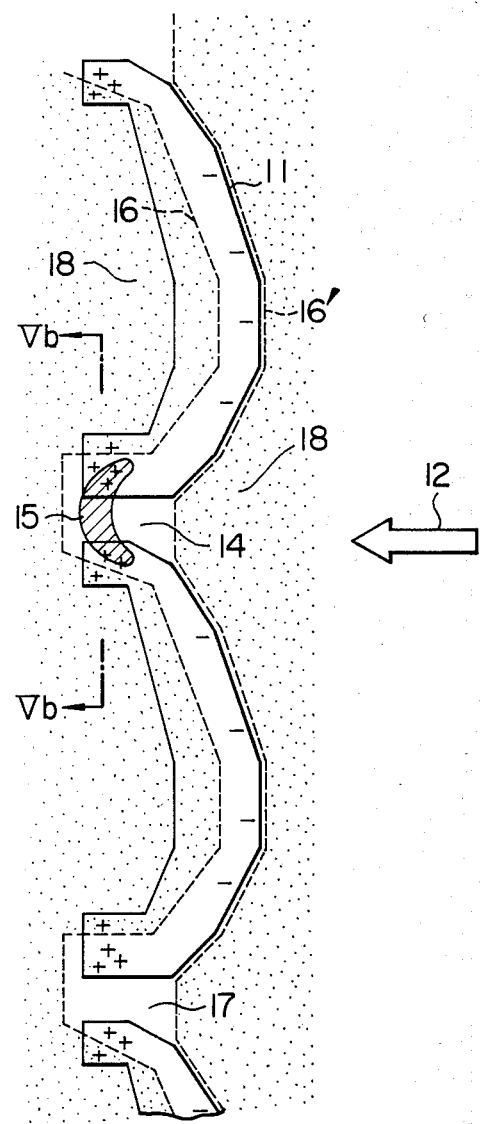
FIGS. 5a and 5b are views showing an embodiment of the present invention.
Figure 5B:
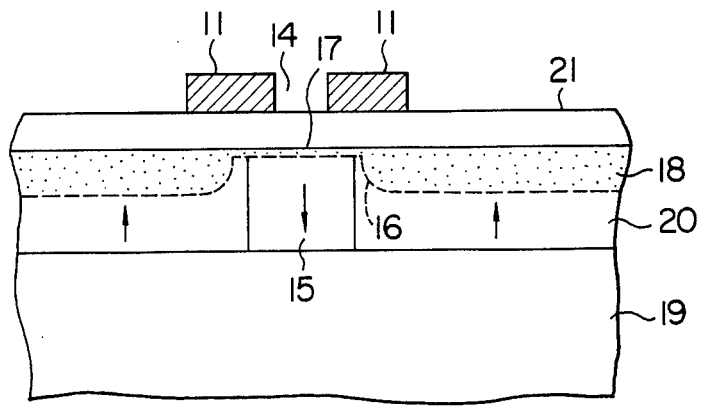

FIG. 5a is a plan view showing an embodiment of the invention and FIG. 5b is a sectional view taken along line Vb—Vb in FIG. 5a. Referring to these figures, numeral 11 denotes permalloy propagation track elements, numeral 12 denotes the direction of an in-plane rotating field, numeral 14 denotes a gap portion between the adjacent permalloy propagation track elements 11, numeral 15 denotes a magnetic bubble, numerals 16 and 16' denote boundaries between a shallowly ion-implanted region 17 and deeply ion-implanted regions 18, numeral 19 denotes a non-magnetic garnet substrate, numeral 20 denotes a magnetic gernet layer, and numeral 21 denotes an insulating spacer. Arrows shown in FIG. 5b represent directions of magnetization.

Describing in more detail by referring to FIGS. 5a and 5b, it is taught by the present invention that the outside of a path along which the magnetic bubble 15 moves in the permalloy propagation track element 11 and the gap portion 14 located therebetween in accordance with the rotation of the in-plane rotating field, that is, a band-like path defined by the shallowly ion-implanted region 17 between the broken boundary lines 16 and 16' is left as the band-like magnetic bubble path, are formed as the deeply ion-implanted regions 18. In this connection, it is noted that the edge of the magnetic bubble path represented by the broken line 16 is located on that side of the permalloy propagation track element 11 which does not serve as the magnetic bubble path, while the edge represented by the broken line 16' is located outside the propagation track element 11 slightly spaced therefrom at that side of the propagation track element 11 which serves as the magnetic bubble path. With this arrangement, the magnetic bubble is repelled from the boundaries (represented by the broken lines 16 and 16') between the shallowly ion-implanted region 17 and the deeply ion-implanted regions 18, so that erroneous operation due to the unwanted stretching of the magnetic bubble to the attractive pole produced in the other bubble propagation track element is successfully prevented.

Figure 6:
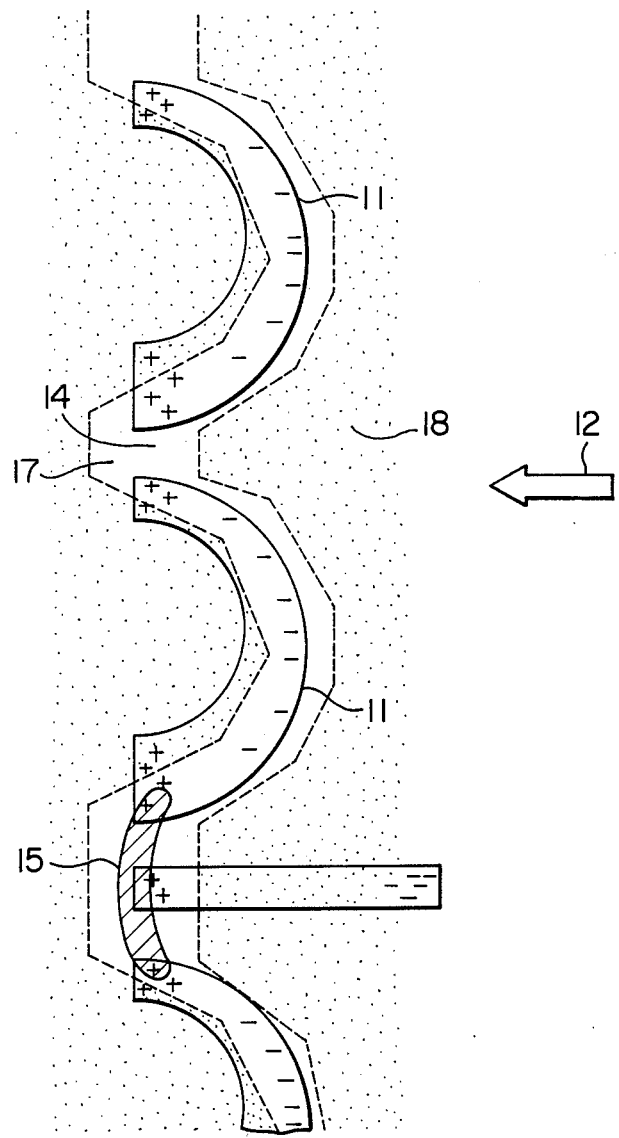
FIG. 6 is a view showing another embodiment of the present invention.

FIG. 6 shows another embodiment of the present invention according to which the permalloy propagation track element 11 is imparted with a smooth arcuate form so that the movement of a magnetic bubble can take place smoothly.

In both of the embodiments described above, the magnetic bubble of 0.5 $\mu$m in diameter is present on the permalloy propagation track element in a state in which it extends as shown by numeral 15.

Figure 7:
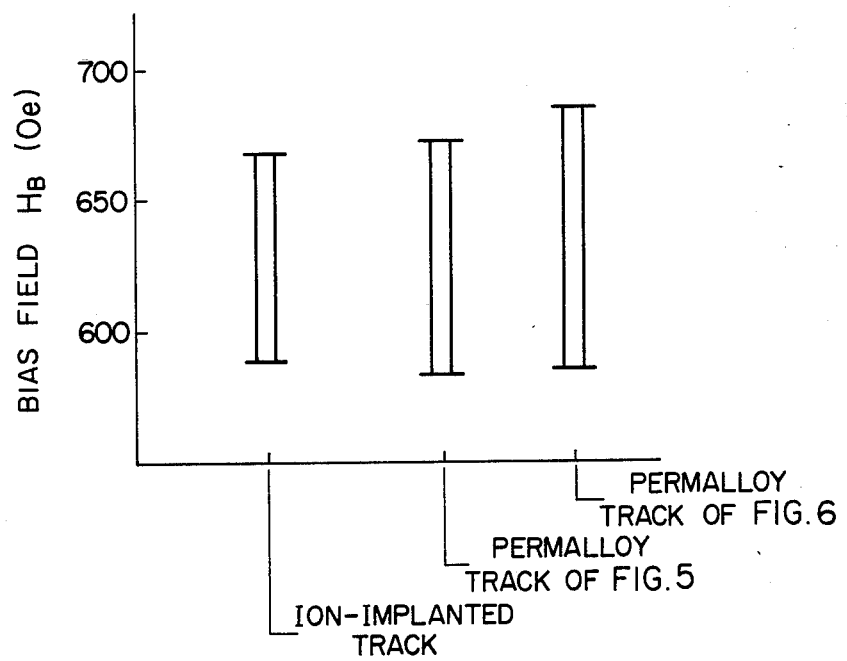
FIG. 7 is a view for illustrating bubble operation characteristics in magnetic bubble devices according to the embodiments of the invention.

In both the embodiments, the magnetic bubble can be normally propagated in the extended state. FIG. 7 illustrates operation characteristics for both the embodiments. As will be seen from FIG. 7, the magnetic bubble can operate on the permalloy propagation track in an enlarged range which encompasses the operation range on the ion-implanted bubble propagation track in either of the illustrated embodiments. In particular, it will be noted that in the case of the permalloy propagation track shown in FIG. 6, the operation range is significantly improved in respect with the upper limit.

Since the operation range of the magnetic bubble of the diameter not greater than 1 $\mu$m available in common to the ion-implanted propagation track and the permalloy propagation track can be increased according to the teaching of the invention, the hybrid bubble device can be advantageously realized with high density. Further, by applying the concept of the invention to the permalloy propagation track of the currently actually used bubble devices, it is possible to enlarge the operation range of the device. It will now be understood that the invention is of great significance for enhancing the reliability of a magnetic bubble memory device.

We claim:

1. A magnetic bubble device comprising first magnetic bubble propagation tracks formed through ion implantation and second magnetic bubble propagation tracks formed along films of a soft magnetic material, wherein said second magnetic bubble propagation tracks are formed so that a region exclusive of a bubble path on said magnetic material film along which a magnetic bubble is to move is ion-implanted more deeply than said bubble path.

2. A magnetic bubble device according to claim 1, wherein a gap region between the adjacent soft magnetic material films is not implanted with ions or is ion-implanted to the substantially same depth as a region defining said bubble path.

3. A magnetic bubble device according to claim 1, wherein said soft magnetic material film is of a chevron-like configuration.

4. A magnetic bubble device according to claim 2, wherein said soft magnetic material film is of a chevron-like configuration.

5. A magnetic bubble device according to claim 1, wherein a boundary between the regions of the different ion implantation depths is located outside said soft magnetic material film slightly spaced therefrom on the side of said bubble path of said soft magnetic material film and is located on said soft magnetic material film on the side thereof opposite to said bubble path.

6. A magnetic bubble device according to claim 2, wherein a boundary between the regions of the different ion implantation depths is located outside said soft magnetic material film slightly spaced therefrom on the side of said bubble path of said soft magnetic material film and is located on said soft magnetic material film on the side thereof opposite to said bubble path.

* * * * *